United States Patent
Shi et al.

(10) Patent No.: US 10,395,955 B2
(45) Date of Patent: Aug. 27, 2019

(54) METHOD AND SYSTEM FOR DETECTING A COOLANT LEAK IN A DRY PROCESS CHAMBER WAFER CHUCK

(71) Applicant: GLOBALFOUNDRIES Singapore Pte. Ltd., Singapore (SG)

(72) Inventors: Lei Shi, Singapore (SG); Bor Shen Chan, Singapore (SG); Joselito Reyes Butiu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 134 days.

(21) Appl. No.: 15/432,925

(22) Filed: Feb. 15, 2017

(65) Prior Publication Data
US 2018/0233388 A1  Aug. 16, 2018

(51) Int. Cl.
*H01L 21/67* (2006.01)
*H01L 21/687* (2006.01)
*G01M 3/00* (2006.01)

(52) U.S. Cl.
CPC ......... *H01L 21/67253* (2013.01); *G01M 3/00* (2013.01); *H01L 21/67115* (2013.01); *H01L 21/68714* (2013.01)

(58) Field of Classification Search
CPC ......... H01L 21/67115; H01L 21/67253; H01L 21/68714
See application file for complete search history.

(56) References Cited

U.S. PATENT DOCUMENTS

| | | | | |
|---|---|---|---|---|
| 5,584,971 | A * | 12/1996 | Komino | C23C 14/541 118/723 E |
| 6,310,323 | B1 * | 10/2001 | Mahawili | H01L 21/67098 118/50.1 |
| 8,124,916 | B2 * | 2/2012 | Kelkar | F27B 17/0025 219/390 |
| 8,393,197 | B2 * | 3/2013 | Monkowski | G01M 3/38 73/40.5 R |
| 2001/0034004 | A1 * | 10/2001 | Kitamura | C23C 16/481 432/250 |
| 2001/0036706 | A1 * | 11/2001 | Kitamura | H01L 21/67109 438/308 |
| 2002/0014084 | A1 * | 2/2002 | Kaneda | H01L 21/67248 62/176.6 |
| 2002/0090735 | A1 * | 7/2002 | Kishkovich | G01N 21/76 436/111 |
| 2007/0187386 | A1 * | 8/2007 | Kim | H01L 21/324 219/385 |

(Continued)

*Primary Examiner* — Joseph M Galvin, III
(74) *Attorney, Agent, or Firm* — Thompson Hine LLP

(57) ABSTRACT

Device and method of configuring a device to process a wafer is disclosed. The device includes a wafer chuck configured to mount the wafer, a dry wafer processing chamber configured to enclose the wafer chuck, a humidity sensor configured to measure relative humidity (RH) at an outlet of the dry wafer processing chamber, a humidity controller coupled to the humidity sensor, the humidity controller being configured to detect a change in RH above a threshold, and a process chamber controller coupled to the humidity controller. The change is triggered by a leakage in deionized water used as a coolant for cooling the wafer chuck and the wafer during the processing. The process chamber controller is configured to trigger a shutdown of the processing of the wafer in response to the leakage.

20 Claims, 3 Drawing Sheets

(56) References Cited

U.S. PATENT DOCUMENTS

| | | | |
|---|---|---|---|
| 2009/0229348 A1* | 9/2009 | Woo | C23C 16/4401 73/40.5 R |
| 2015/0184943 A1* | 7/2015 | Abel | F27B 3/24 373/8 |
| 2017/0097273 A1* | 4/2017 | Yang | H01L 21/67288 |
| 2017/0191897 A1* | 7/2017 | Mueller | G01M 3/20 |

* cited by examiner

METHOD AND SYSTEM FOR DETECTING A COOLANT LEAK IN A DRY PROCESS CHAMBER WAFER CHUCK

BACKGROUND

It is well known that semiconductor wafer substrates (or wafers) go through a series of semiconductor processing steps such as deposition, photolithography, etching, doping, polishing, packaging, and others, to fabricate integrated circuit (IC) chips. For example, one such commercially available wafer photoresist stabilization process may be used to enhance the adhesion of photoresist materials to the wafer substrates and reduce or eliminate critical defects caused by photoresist mask deformation after features are defined by lithography. Another example of a commercially available wafer charge clear process may be used to remove charge that may be generated during device manufacturing or presence of high electric fields caused by implantation, annealing, chemical vapor deposition (CVD), thermal cycling and other high-energy processes. Yet another example of commercially available wafer memory erasure process may be used to fully erase and deprogram for erasable programmable read-only memory (EPROM) device wafer.

During the wafer photoresist stabilization or charge clear or memory erasure process, it is common for a wafer chuck, which is used to mount the wafer, to undergo numerous heating and cooling cycles. These cycles typically induce thermal stress in the wafer chuck, which results in the generation of minor cracks. The presence of minor cracks causes leaks in coolant that may be used to cool the wafer chuck. Traditional techniques for detecting leakage are often not responsive enough to avoid wastage of material in the form of scrapped wafers.

From the foregoing discussion, it is desirable to provide tools and techniques to improve early detection, performance, reliability and lower cost of detecting leaks during the wafer hardening process.

SUMMARY

Embodiments generally relate to device and method of processing a semiconductor wafer. In one embodiment, a device for processing a wafer is disclosed. The device includes a wafer chuck configured to mount the wafer, a dry wafer processing chamber configured to enclose the wafer chuck, a humidity sensor configured to measure relative humidity (RH) at an outlet of the dry wafer processing chamber, a humidity controller coupled to the humidity sensor, the humidity controller being configured to detect a change in relative humidity (RH) above a threshold, and a process chamber controller coupled to the humidity controller. The change is triggered by a leakage in deionized water used as a coolant for cooling the wafer chuck and the wafer during the processing. The process chamber controller is configured to trigger a shutdown of the processing of the wafer in response to the leakage.

In yet another embodiment, a method to configure a dry wafer processing chamber to process a wafer is disclosed. The dry wafer processing chamber is configured to accommodate a wafer chuck, the wafer chuck being configured to mount the wafer for processing. The wafer chuck is further configured to be cooled by deionized water. The processing of the wafer may also be configured to include baking the wafer at a configurable baking temperature by using an ultraviolet (UV) energy source; cooling the wafer chuck during a cooling phase of the processing; and purging compressed dry air (CDA) to purge the deionized water in response to a completion of the cooling phase. Relative humidity (RH) is measured at an outlet of the dry wafer processing chamber. A change in the RH that is greater than a threshold value is detected, the change being caused by a leak in the deionized water. A shutdown of the processing is triggered in response to the change.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Novel features believed to be characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various blocks, devices or components (e.g., controller) described herein may be implemented as hardware (including discrete components, integrated circuits and systems-on-a-chip 'SoC'), firmware (including application-specific integrated circuits and programmable chips) and/or software or a combination thereof, depending on the application requirements.

Similarly, the functionality of various mechanical elements, members, and/or components for forming modules, sub-assemblies and assemblies assembled in accordance with a structure for an apparatus may be implemented using various materials and coupling techniques, depending on the application requirements.

Descriptive and directional terms used in the written description such as top, bottom, left, right, upstream, downstream, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Embodiments generally relate to fabrication of wafers that may be used to manufacture semiconductor devices or ICs. Other types of devices may also be useful. The devices can be any type of IC, such as SoC. The devices can be incorporated into, for example, consumer electronic products, such as computers, cell phones, wireless electronic devices like watches, cameras, printers, and several types of tablet computing devices. Incorporating the devices in other applications may also be useful.

Figure 1A:
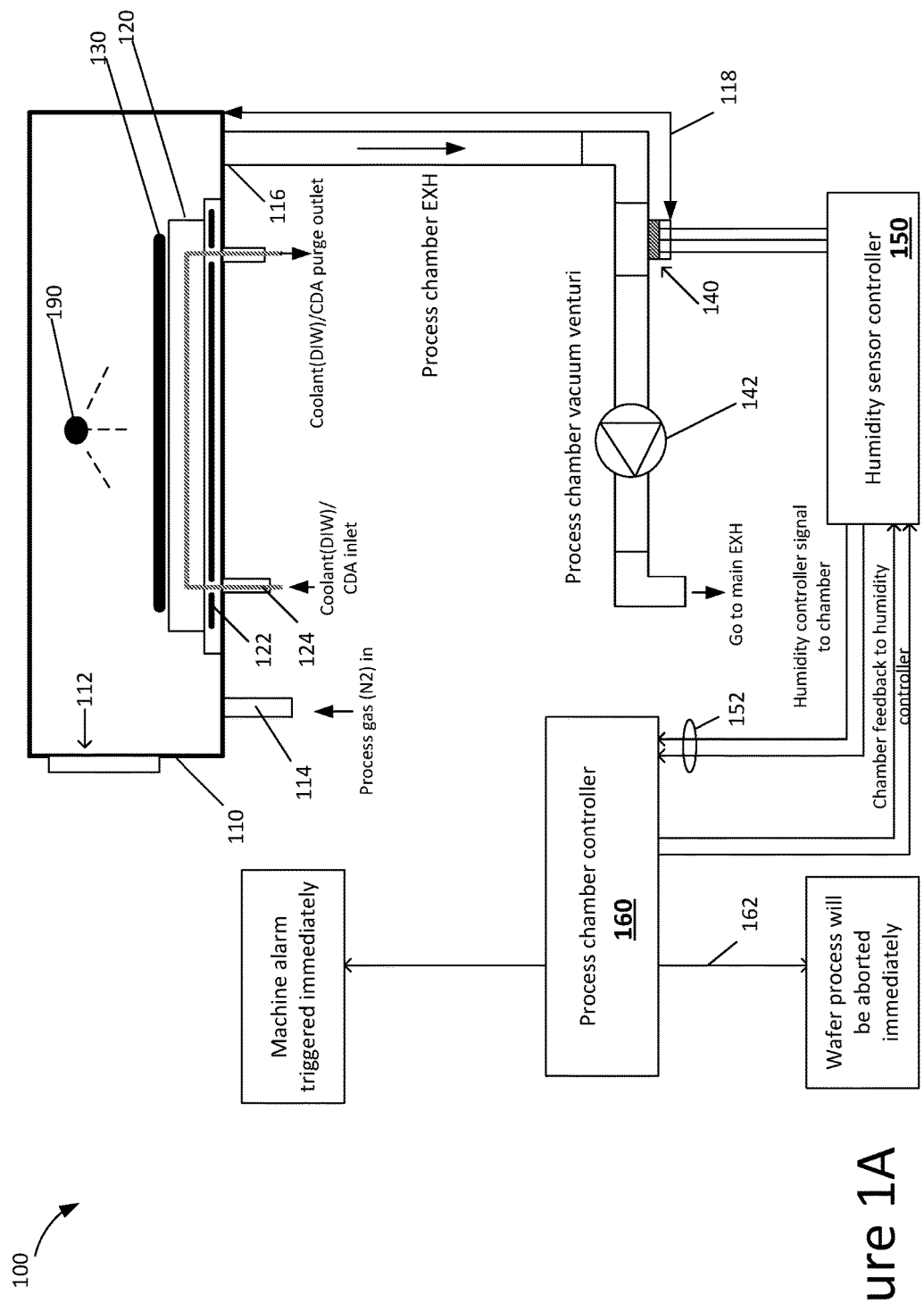
FIG. 1A shows a simplified block diagram of an embodiment of a device configured to process a wafer.

FIG. 1A shows a simplified block diagram of an embodiment of a device 100 configured to process a wafer. In the depicted embodiment, the device 100 is configured to include a dry wafer processing chamber 110, a wafer chuck 120 configured to mount a wafer 130, a humidity sensor 140, a humidity sensor controller 150 and a process chamber controller 160.

The dry wafer processing chamber 110 (may also be referred to as the process chamber 110) is typically configured to include an inlet 114 to receive fluids (e.g., inert gas) that may be used in the wafer processing operations and an outlet 116 to exhaust the fluids after the use. The dry wafer processing chamber 110 also includes a slit door 112 to transfer the wafer 130 into the dry wafer processing chamber 110 for the processing of the wafer 130 and out of the dry wafer processing chamber 110 upon completion of the processing.

During normal wafer processing operations, the dry wafer processing chamber 110 is typically operating at a controlled temperature and pressure and is sealed from the atmosphere. In an embodiment, an energy source such as an ultraviolet (UV) light 190 may be used to increase the temperature of the dry wafer processing chamber 110 during the processing of the wafer 130.

In an embodiment, the wafer 130 may be mounted on the wafer chuck 120 by using vacuum contacts (not shown). Other wafer mounting techniques may also be useful. The wafer chuck 120 may be configured to include an electric heating element 122 to provide heat to the wafer chuck 120 and the wafer 130 during a baking phase of the processing. The wafer chuck may also include a coolant loop 124 to transfer heat and cool the wafer chuck 120 and the wafer 130 during a cooling phase of the processing. During the baking phase, an energy source such as an ultraviolet (UV) light 190 may also be used to increase the temperature of the dry wafer processing chamber 110, the wafer chuck 120 and the wafer 130. Additional details of the processing phases are described with reference to FIG. 2.

In an embodiment, deionized water is used as a coolant, which flows through the coolant loop 124. During normal cooling operation, deionized water flowing through the coolant loop 124 is in the form of a fluid (e.g., liquid or vapor depending on the temperature and pressure). In addition, during normal operation, the coolant loop 124 is either sealed or contained, thereby ensuring the integrity of the coolant loop and eliminating any leakage of the deionized water. In an embodiment, quality of the deionized water may be selected to have at least 1.0 mega ohm of resistivity ($1.0 \times 10^6$ ohm·cm resistivity). The deionized water may be supplied at a minimum pressure of 15 psig ($1.0$ kg/cm$^2$). Other suitable parameters may also be useful.

Leakage of deionized water is an abnormal event that may occur during the processing of the wafer 130, specifically during the cooling phase. During the processing, the wafer chuck 120 goes through several high temperature heating/cooling cycles, which induces thermal stress and causes fracture of the material used to fabricate the wafer chuck 120. Hairline or minor cracks minor may be generated in the coolant loop 124 due to the thermal stress buildup causing the deionized water to leak.

In an embodiment, the humidity sensor 140 is configurable to measure relative humidity (RH) of the exhaust fluids being purged out of the outlet 116. The RH of exhaust fluids is indicative of the RH within the dry wafer processing chamber 110 since the dry wafer processing chamber 110 is sealed during normal wafer processing operations. Operating temperatures within the dry wafer processing chamber 110 may reach 240 degrees Celsius during normal operations. Since many commercially available humidity sensors may not be rated to withstand such high temperatures, it may be desirable to place the humidity sensor 140 outside of the dry wafer processing chamber 110.

In an embodiment, the humidity sensor 140 may be disposed within a configurable distance D 118 of the outlet 116. The configurable distance D 118 may be selected in dependence of an operating temperature range of the humidity sensor 140 (e.g., temperature drops to about 80 degrees Celsius at the point of measurement). In the depicted embodiment, the humidity sensor 140 is located upstream of a process chamber vacuum venturi pump device 142.

In the depicted embodiment, the humidity sensor controller 150 is coupled to the humidity sensor 140 and the humidity sensor controller 150 is coupled to the process chamber controller 160. In response to an occurrence of abnormal event such as leakage of deionized water, the RH value measured by the humidity sensor 140 increases in the dry wafer processing chamber 110. The increased moisture content within the dry wafer processing chamber 110 is vacuumed by the process chamber vacuum venturi pump device 142. RH will also increase at the outlet and along the suction pipe. The humidity sensor will then capture this sudden increase in RH. When the humidity sensor controller 150 detects a change in the value of RH that is greater than a threshold value (e.g., greater than or equal to 10%), the humidity sensor controller 150 may send an alarm message 152 to the process chamber controller 160. In response to receiving the alarm message 152, the process chamber controller 160 then promptly sends a trigger 162 to shut down the processing. For example, wafer processing operations of the wafer processing chamber is shut down in response to the leakage of the deionized water, thereby reducing the number of scrapped wafers.

In an embodiment, the humidity sensor 140, the process chamber controller 160 and the humidity sensor controller 150 may be any suitable or well-known, commercially available electronic devices. In some applications, the process chamber controller 160 and the humidity sensor controller 150 may be combined into one device.

Figure 1C:
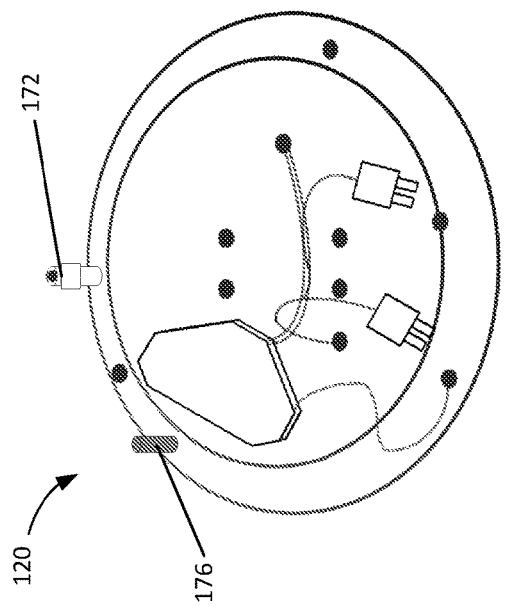
FIG. 1C shows a bottom view illustrating additional details of a wafer chuck described with reference to FIG. 1A.
Figure 1B:
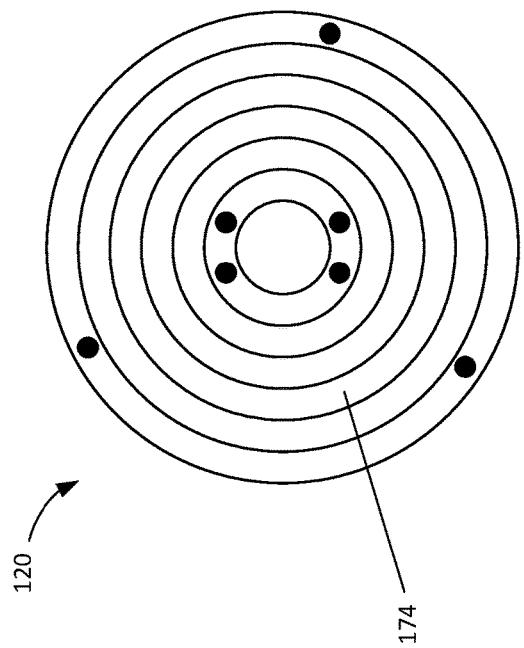
FIG. 1B shows a top view illustrating additional details of a wafer chuck described with reference to FIG. 1A.

FIG. 1B shows a top view illustrating additional details of the wafer chuck 120 described with reference to FIG. 1A. FIG. 1C shows a bottom view illustrating additional details of the wafer chuck 120 described with reference to FIG. 1A. Referring to FIGS. 1B and 1C, the wafer chuck 120 may be fabricated using low thermal mass anodized aluminum and may include an electric resistance heater (not shown) mounted on the underside. Interior ports circulate air and coolant (or deionized water) throughout the body of the wafer chuck 120, and welded ports accommodate fluid inlet and outlet fittings 172. Vacuum grooves 174 may be machined into the surface of the wafer chuck 120, and connected by a common internal port with a threaded hole to accept a hose barb for a vacuum connection 176.

Figure 2:
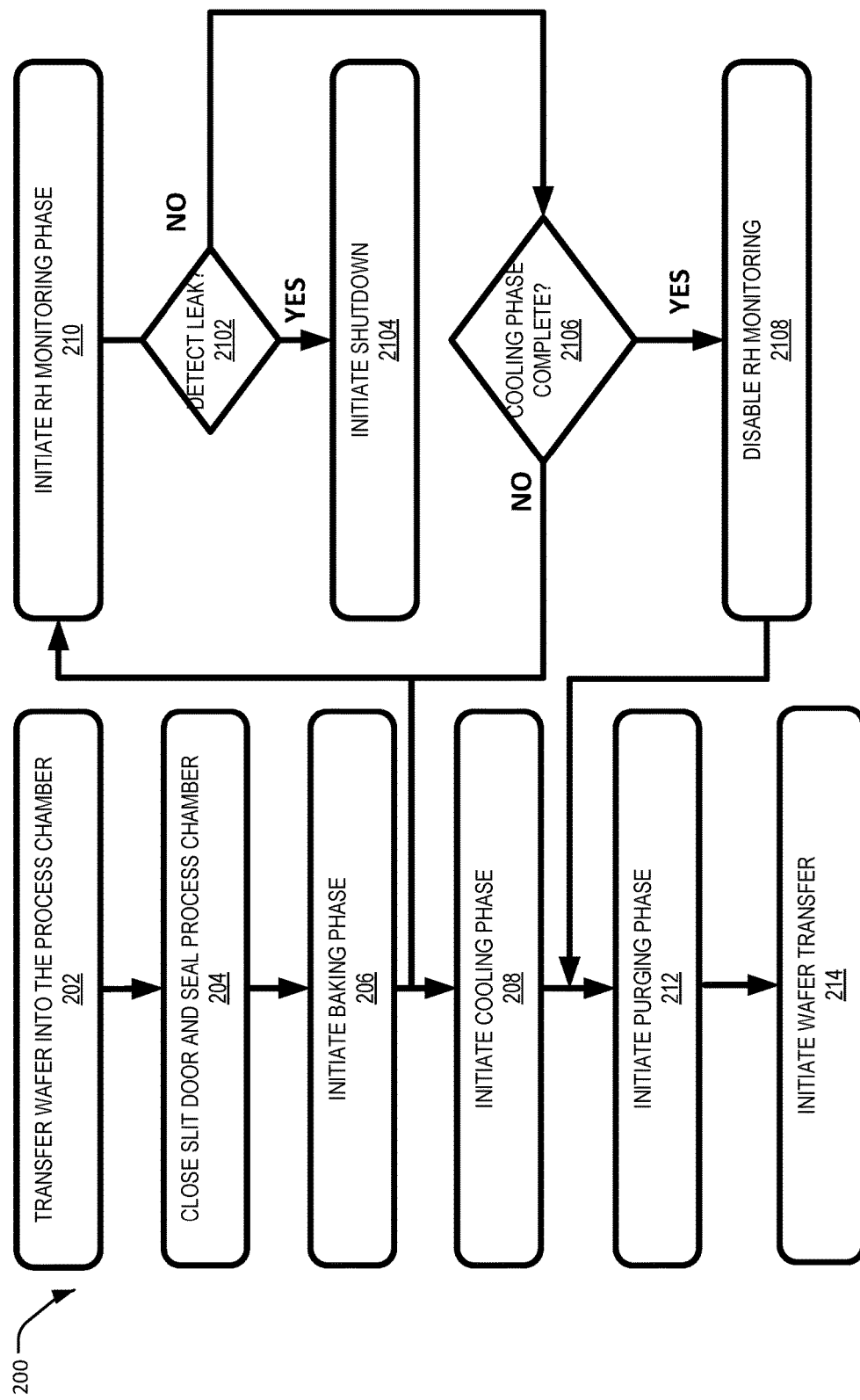
FIG. 2 shows a flow diagram illustrating a sequence of operations performed by a device configured to process the wafer as described with reference to FIGS. 1A, 1B and 1C.

FIG. 2 illustrates a sequence of operations 200 performed by the device 100 to process the wafer 130 as described with reference to FIGS. 1A, 1B and 1C. In an embodiment, the sequence of operations 200 may also be referenced as one or more phases associated with a photoresist stabilization or charge clear or memory erasure process for the wafer. In an embodiment, the process chamber controller 160 may be configured to control the sequence of operations 200.

As described earlier, the UV source 190 may be used to enhance the adhesion of photoresist materials to semiconductor wafer substrates or to clear charge on wafer or to erase and deprogram EPROM device wafer. Employing UV exposure with ramped temperature control, the process may be effective when used prior to aluminum plasma etching, high current ion implantation, or thin film deposition. The hardening or "stabilizing" effect is brought about by the cross-linking of polymers within the photoresist material (or light sensitive coating). After processing, the photoresists may be readily removed by plasma ashing (which is the process of removing the photoresist material from an etched wafer), or by a milder plasma de-scum cycle and wet stripping.

At operation 202, the wafer 130 is transferred into the process chamber 110 by opening the slit door 112. In an embodiment, the transfer operation may include mounting the wafer 130 onto the wafer chuck 120 using a vacuum. Depending on the process specifications, the approximate idling temperature of the process chamber 110 may be configured to be about 100 degrees Celsius. Other suitable temperatures may also be useful. At operation 204, the process chamber 110 is sealed from the atmosphere when the slit door 112 is closed. In an embodiment, a time delay may be introduced by the process chamber controller 160 between operation 202 and 204 to ensure that the slit door 112 is closed.

At operation 206, a baking phase of the processing is initiated. During this phase, an inert gas (e.g., nitrogen) is introduced into the process chamber 110 via the inlet 114 and concurrently with this action, energy is also provided to the process chamber 110 by activating the UV source 190 and the electric resistance heater 122. Temperature inside the process chamber 110 may be ramped up by the process chamber controller 160 from the initial idling temperature of about 100 degrees Celsius to a final target value (as determined by the process specifications). In an embodiment, the final target value of the temperature may be set between 150 to 240 degrees Celsius. Depending on the process specifications, the process chamber controller 160 may be configured to maintain a temperature of the process chamber 110 at or close to the final target value for a period of about 10 seconds.

At operation 208, a cooling phase of the processing is initiated. The energy sources (e.g., the UV source 190 and the electric resistance heater) are deactivated. The deionized water is circulated in the coolant loop 124 to cool the wafer chuck 120 from the final target temperature of approximately between 150 to 240 degrees Celsius to the idling temperature of about 100 degrees Celsius.

At operation 210, which occurs in parallel and concurrent with operation 208, a RH monitoring phase is initiated. The humidity sensor controller 150 is configured to monitor the humidity sensor 140 during the cooling phase to determine if there is a change in the RH value that is greater than the threshold value. Any leakage of the deionized water flowing through coolant loop during the cooling phase causes the RH within the process chamber 110 to increase rapidly. At decision point 2102, if the change in the RH is at least equal to the threshold value (e.g., 10%) then the humidity sensor controller 150 sends an alarm message to the process chamber controller 160 and the process chamber controller 160 triggers a shutdown of the processing of the wafer at operation 2104.

In an embodiment, the RH setting in the humidity controller is configured to have a normal operating value between 0% and less than 10%. The leakage may be classified as a minor leak in response to the RH having a value between 10% and less than 30%, as a medium leak in response to the RH having a value between 30% and less than 60%, and as a major leak in response to the RH having a value greater than 60%.

At decision point 2106, the humidity sensor controller 150 continues with the monitoring of the humidity sensor 140 during the cooling phase if change in the RH value is less than the threshold. The hardening process of the wafer is essentially completed at the end of the cooling phase and RH monitoring is disabled at operation 2108 and program control is returned to operation 212.

At operation 212, a purging phase is initiated when the temperature of the wafer chuck and the wafer reaches the idling temperature and the cooling phase is complete. During the purging phase, compressed dry air (CDA) purges the deionized water from the coolant loop upon completion of the cooling phase. As described in operation 2108, the humidity sensor controller 150 is configured to disable monitoring of the humidity sensor 140 to avoid generating false alarms and eliminating nuisance shutdowns due to changes in the RH. At operation 214, supply of the inert gas is shut off and the slit door is opened to enable a transfer of the wafer.

The order in which any process or method described herein is not intended to be construed as a limitation, and any number of the described process blocks can be combined in any order to implement the process, method or alternate method. For example, operations 208 and 210 are performed concurrently and in parallel. Additionally, individual blocks may be deleted from the process without departing from the spirit and scope of the subject matter described herein. Furthermore, the process may be implemented in any suitable hardware, software, firmware, or a combination thereof, without departing from the scope of the invention.

The embodiments as described above result in advantages. Many devices used in wafer hardening applications are based on traditional water leakage detection methods like proximity sensor, fiber-optic sensor, and other similar types, which are often not responsive enough to avoid generating an excessive amount of scrapped wafers. That is, the lag time from water leak detection to corrective action is too large compared to the processing time of a wafer.

Leakage of the deionized water may likely occur during the cooling phase. The device 100 advantageously monitors RH measurements continuously during the cooling phase and instantly triggers a shutdown of the processing of the wafer if a significant change in RH is detected. The leakage detection technique which measures the significant change in RH may also be used to estimate the severity of the leakage. As a result of the continuous RH measurement performed in parallel with the cooling phase, quick detection of change in RH and instant corrective action with a process shutdown, loss of material due to scrapped wafers is minimized.

The humidity sensor is advantageously placed at a configurable distance D from the outlet. It is estimated that the temperature drops to about 80 degrees Celsius at the point of RH measurement. This technique reduces cost and increases the reliability of the process since the operating temperature range of the humidity sensor is significantly reduced compared to the dry wafer processing chamber based water leak detection techniques.

In addition, the device 100 advantageously uses humidity sensor based water leakage detection that has been successfully installed in high volume, fast speed semiconductor manufacturing operations. Therefore, compared to traditional methods, the device 100 uses simple, scalable, reliable, cost effective tools and techniques for early detection of water leakage in wafer hardening processes.

The term "techniques" for instance, may refer to one or more devices, apparatuses, systems, methods, and articles of manufacture, as indicated by the context described herein. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method comprising:
    configuring a dry wafer processing chamber to process a wafer, wherein the dry wafer processing chamber comprises a wafer chuck with a flat mounting surface for mounting the wafer for processing, the wafer chuck is further configured to include a coolant loop within the wafer chuck, and the coolant loop is disposed under the wafer for transferring heat and cooling the wafer chuck by a coolant during a cooling phase of the processing;
    measuring relative humidity (RH) of the dry wafer processing chamber;
    detecting a change in the RH greater than a threshold value, the change being caused by a leak in the coolant; and
    triggering a shutdown of the processing in response to the change.

2. The method of claim 1, further comprising:
    flowing the coolant through the coolant loop during the cooling phase of the processing to cool the wafer chuck,
    wherein the coolant comprises deionized water.

3. The method of claim 1, wherein the RH is measured at an outlet of the dry wafer processing chamber.

4. The method of claim 1, wherein the shutdown occurs during the cooling phase.

5. The method of claim 3, wherein the RH is measured by a humidity sensor, and the humidity sensor is bypassed during a wafer transfer phase of the processing.

6. The method of claim 5, wherein the humidity sensor is disposed within a configurable distance of the outlet, and the configurable distance is selected in dependence of an operating temperature range of the humidity sensor.

7. The method of claim 2, wherein the deionized water is used to cool the wafer chuck to a configurable idle temperature.

8. The method of claim 1, wherein the threshold value of the RH is at least 10%.

9. A method comprising:
    configuring a dry wafer processing chamber to process a wafer, wherein the dry wafer processing chamber is configured to accommodate a wafer chuck, the wafer chuck is configured to mount the wafer for processing, the wafer chuck is further configured to include a coolant loop within the wafer chuck, and the wafer chuck is further configured to be cooled by deionized water during a cooling phase;
    baking the wafer at a configurable baking temperature by using an ultraviolet (UV) energy source;
    cooling the wafer chuck during the cooling phase of the processing;
    purging compressed dry air (CDA) through the coolant loop to purge the deionized water in response to a completion of the cooling phase;
    measuring relative humidity (RH) of the dry wafer processing chamber;
    detecting a change in the RH greater than a threshold value, the change being caused by a leak in the deionized water; and
    triggering a shutdown of the processing in response to the change.

10. A method comprising:
    configuring a dry wafer processing chamber to process a wafer, wherein the dry wafer processing chamber comprises a wafer chuck with a flat mounting surface for mounting the wafer for processing, the wafer chuck is further configured to include a coolant loop within the wafer chuck, the coolant loop is disposed under the wafer for transferring heat and cooling the wafer chuck by a coolant during a cooling phase of the processing, and the coolant comprises deionized water;
    measuring relative humidity (RH) of the dry wafer processing chamber;
    detecting a change in the RH greater than a threshold value, the change being caused by a leak in the coolant; and
    triggering a shutdown of the dry wafer processing in response to the change.

11. The method of claim 10, wherein the coolant flows through the coolant loop during the cooling phase of the dry wafer processing.

12. The method of claim 10, wherein the RH is measured at an outlet of the dry wafer processing chamber.

13. The method of claim 12, wherein the RH is measured by a humidity sensor, and the humidity sensor is bypassed during a wafer transfer phase of the processing.

14. The method of claim 13, wherein the humidity sensor is disposed within a configurable distance of the outlet, and the configurable distance is selected in dependence of an operating temperature range of the humidity sensor.

15. The method of claim 10, wherein the dry wafer processing further comprising:
    baking the wafer at a configurable baking temperature by using an ultraviolet (UV) energy source;
    cooling the wafer chuck during the cooling phase of the dry wafer processing; and
    purging compressed dry air (CDA) through the coolant loop to purge the coolant in response to a completion of the cooling phase.

16. The method of claim 15, wherein the UV energy is deactivated during the cooling phase of the dry wafer processing.

17. The method of claim 10, wherein the shutdown occurs during the cooling phase.

18. The method of claim 10, wherein the coolant is used to cool the wafer chuck to a configurable idle temperature.

19. The method of claim 10, wherein the threshold value of the RH is at least 10%.

20. The method of claim 10, wherein the dry wafer processing chamber is sealed from the atmosphere.

* * * * *